United States Patent
Hsieh et al.

(10) Patent No.: US 9,321,635 B2
(45) Date of Patent: Apr. 26, 2016

(54) METHOD TO RELEASE DIAPHRAGM IN MEMS DEVICE

(71) Applicant: Solid State System Co., Ltd., Hsinchu (TW)

(72) Inventors: Tsung-Min Hsieh, New Taipei (TW); Chien-Hsing Lee, Hsinchu County (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 14/092,929

(22) Filed: Nov. 28, 2013

(65) Prior Publication Data

US 2015/0147841 A1     May 28, 2015

(51) Int. Cl.
*H01L 21/00*     (2006.01)
*B81C 1/00*     (2006.01)

(52) U.S. Cl.
CPC ......... *B81C 1/00928* (2013.01); *B81C 1/00476* (2013.01)

(58) Field of Classification Search
None
See application file for complete search history.

(56) References Cited

U.S. PATENT DOCUMENTS

| | | | |
|---|---|---|---|
| 6,537,380 B2* | 3/2003 | Zazerra et al. | 134/2 |
| 2006/0063293 A1* | 3/2006 | Benzel et al. | 438/53 |
| 2009/0180647 A1 | 7/2009 | Chen et al. | |
| 2011/0275222 A1* | 11/2011 | Sun et al. | 438/753 |
| 2011/0300659 A1* | 12/2011 | Hsieh et al. | 438/53 |

* cited by examiner

*Primary Examiner* — Calvin Choi
(74) *Attorney, Agent, or Firm* — Jianq Chyun IP Office

(57) ABSTRACT

A method for releasing a diaphragm of a micro-electro-mechanical systems (MEMS) device at a stage of semi-finished product. The method includes pre-wetting the MEMS device in a pre-wetting solution to at least pre-wet a sidewall surface of a cavity of the MEMS device. Then, a wetting process after the step of pre-wetting the MEMS device is performed to etch a dielectric material of a dielectric layer for holding the diaphragm, wherein a sensing portion of the diaphragm is released from the dielectric layer.

7 Claims, 4 Drawing Sheets

METHOD TO RELEASE DIAPHRAGM IN MEMS DEVICE

BACKGROUND OF THE INVENTION

1. Field of Invention

The present invention relates to fabrication of a micro-electro-mechanical systems (MEMS) device. More particularly, the present invention relates to a technology of releasing diaphragm of a MEMS device.

2. Description of Related Art

A MEMS device, such as MEMS microphone, basically includes two main structure parts, one of which is a diaphragm and another of which is a backplate. The diaphragm can be moved due to external factors.

Taking MEMS microphone as an example, the backplate has venting holes to connect to a cavity, which usually receives acoustic signal. The variance of the air pressure from the acoustic signal would cause the vibration of the diaphragm, so that the diaphragm can sense the acoustic signal. When the diaphragm is vibrated by the acoustic signal, the distance between the diaphragm and the backplate, which is steadily still, would also be changed correspondingly, and a variance of capacitance between the diaphragm and the backplate in response to the acoustic signal can be converted into electric signal for subsequent use by the electronic system on which the MEMS microphone is implemented.

As the operating mechanism of the MEMS device, the sensitivity is depending on how the diaphragm responds to acoustic signal or any force factor asserted on the diaphragm. In semiconductor fabrication procedure, the diaphragm is usually formed with the dielectric layer, which may involve multiple sub dielectric layers as known in the art. At the stage of semi-finished product before the diaphragm is released, the diaphragm is embedded in the dielectric layer. It usually needs a wet etching process to etch a portion of the dielectric material, so as to release the diaphragm, and therefore allow the diaphragm to sense the detected force factor, such as the air pressure of the acoustic signal.

The sensitivity of the MEMS device is quite related to the capability of shift of the diaphragm. However, during the wet etching process, the etchant relative to the silicon substrate having the cavity is hydrophobic or repellent, so a bubble may occur on the surface of the substrate. The bubble may cover a portion of surface of the dielectric layer, and may result in poor condition for the wet etching process on the dielectric material.

SUMMARY OF THE INVENTION

The invention provides a method for releasing a diaphragm of a micro-electro-mechanical systems (MEMS) device at a stage of semi-finished product. As a result, bubbles existing at the dead corner of a cavity of the MEMS device can be effectively reduced. The wet etching process can be performed in better quality.

The invention provides a method for releasing a diaphragm of a micro-electro-mechanical systems (MEMS) device at a stage of semi-finished product. The method includes pre-wetting the MEMS device in a pre-wetting solution to at least pre-wet a sidewall surface of a cavity of the MEMS device. Then, a wetting process after the step of pre-wetting the MEMS device is performed to etch a dielectric material of a dielectric layer for holding the diaphragm, wherein a sensing portion of the diaphragm is released from the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, the method to etch the dielectric material for releasing the diaphragm of a MEMS device is proposed. Embodiments are provided below for describing the invention but not for limiting the invention.

Figure 1:
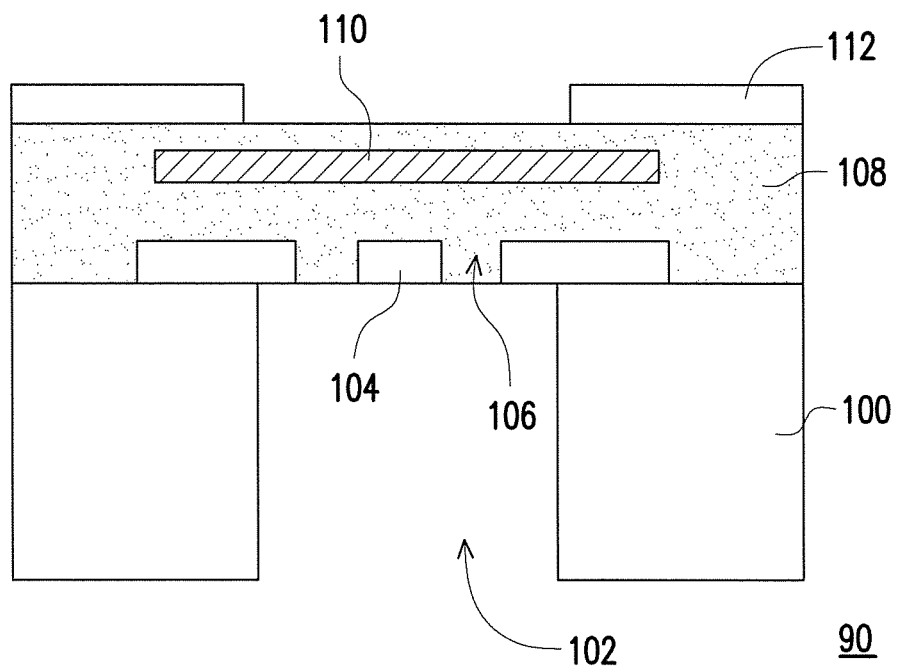
FIG. 1 is a cross-sectional view, schematically illustrating a MEMS device at the stage of semi-finished product, according to an embodiment of the invention.

FIG. 1 is a cross-sectional view, schematically illustrating a MEMS device at the stage of semi-finished product, according to an embodiment of the invention. In FIG. 1, a MEMS device 90, such as a MEMS microphone, basically includes two main structure parts that one is a diaphragm 110 and another one is backplate 104. In better detail, a semiconductor substrate 100, such as silicon substrate, is provided as a base. A cavity is formed in the substrate 100. The backplate 104 is formed over the substrate 100. Here, the backplate 104 can be conductive layer, such as polysilicon layer. The backplate 104 may also include a top portion of the substrate 100 in stack. The backplate 104 is a firm layer and has venting holes 106. The diaphragm 110 is disposed over the backplate 104 by a distance. As known in semiconductor fabrication, the processes for forming the structures of the diaphragm 110 and the backplate 104 also need the dielectric layer 108 to perform photolithographic and etching process. So, the dielectric layer 108, including multiple sub dielectric layers, encloses the diaphragm 110 at the stage of semi-finished product. Further, in order to reserve a side portion of the dielectric layer 108 for holding the diaphragm at the end product, an etching stop layer 112 is formed on the dielectric layer 108.

The etching stop layer has an opening to expose the MEMS region for releasing the diaphragm in later wet etching process.

Figure 2:
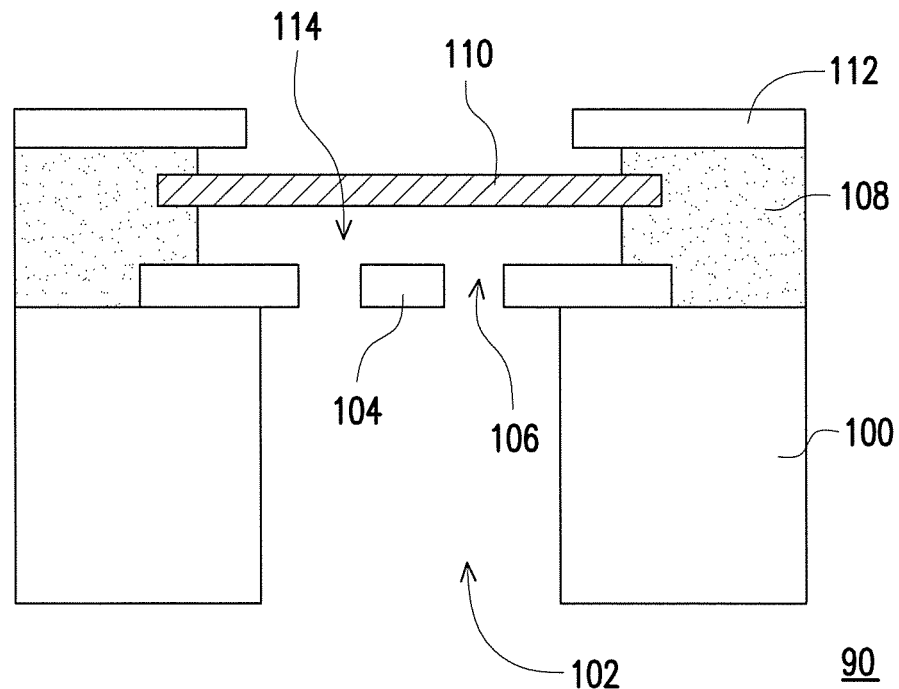
FIG. 2 is a cross-sectional view, schematically illustrating a MEMS device after etching the dielectric material in FIG. 1, according to an embodiment of the invention.

FIG. 2 is a cross-sectional view, schematically illustrating a MEMS device after etching the dielectric material in FIG. 1, according to an embodiment of the invention. In FIG. 2, the dielectric layer 108 is etched by wet etching process to release the diaphragm 110. The dielectric layer 108 in wet etching process is also etched from the other side through the cavity 102 and the venting holes 106. As a result, a chamber 114 can be formed between the diaphragm 110 and the backplate 104, so the diaphragm 110 can move to sense asserting force. The camber 114 is connected to the cavity 102 by the venting holes 106. Taking the MEMS microphone as an example, the acoustic signal can be received by the cavity 102 and reach to the diaphragm 110. The diaphragm 110 can then vibrate with the acoustic signal due to the change of air pressure.

Remarkably, the performance of the diaphragm 110 for sensing the external signal is one of the main factors to decide the sensitivity of the MEMS. If the diaphragm 110 in wet etching process is not well released, the performance of the diaphragm 110 is then reduced.

Figure 3:
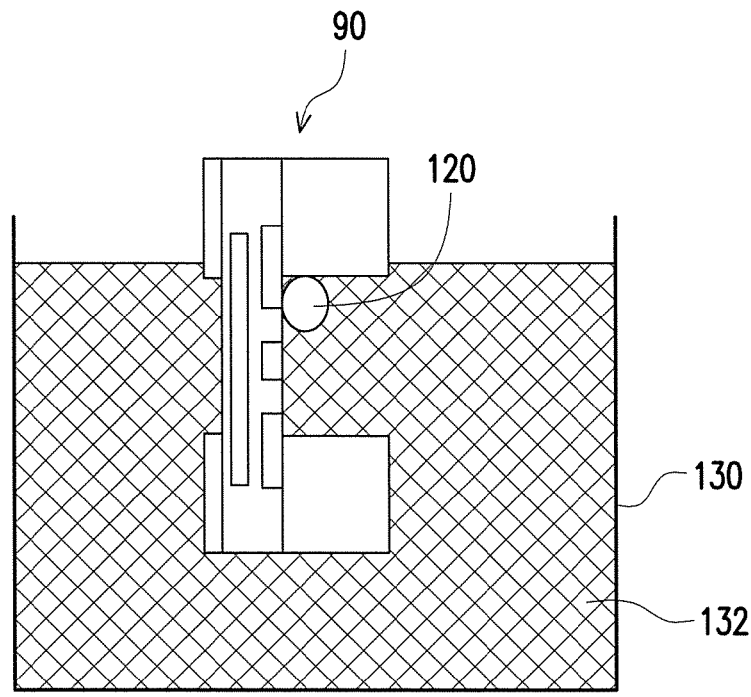
FIG. 3 is a drawing, schematically illustrating the etching mechanism in conventional etching process, as investigated in the invention.
Figure 4:
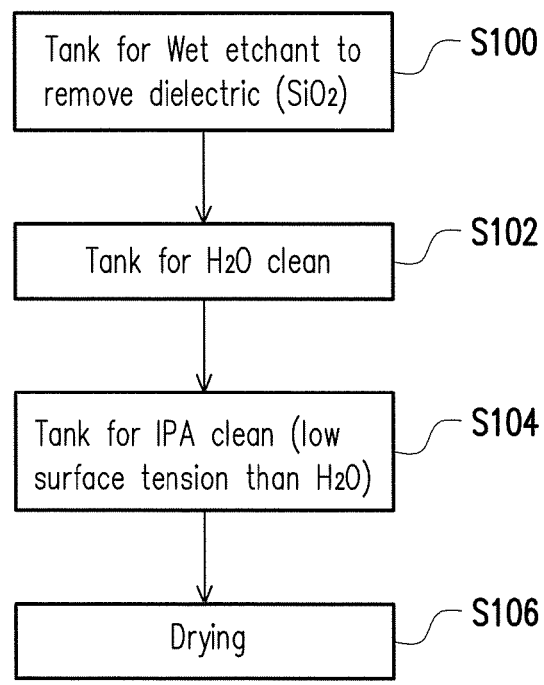
FIG. 4 is a fabrication procedure, schematically illustrating the conventional procedure to etch the MEMS device at the stage of semi-finished product shown in FIG. 1, as investigated in the invention.

Before describing the etching process proposed by the invention, a bubble issue in etching process has been investigated. FIG. 3 is a drawing, schematically illustrating the etching mechanism in conventional etching process, as investigated in the invention. FIG. 4 is a fabrication procedure, schematically illustrating the conventional procedure to etch the MEMS device at the stage of semi-finished product shown in FIG. 1, as investigated in the invention.

With reference to FIG. 3 and FIG. 4, the usual wet etching process is performed on the dielectric material for releasing the diaphragm of MEMS device at the stage of semi-finished product. As the usual way, in step 100, the MEMS device 90 at the stage of semi-finished product is directly dipped into the tank 130, to which the etchant 132 is filled, so as to etch the dielectric material. However, the etchant to the semiconductor substrate 100 is hydrophobic, so a bubble 120 is usually formed on the sidewall of the cavity 102 at a dead corner. As a result the bubble 120 may cover a portion of surface of the venting holes 106 and reducing the etching rate for removing the dielectric material. As a result, the diaphragm 110 may be not well released and has dielectric residue thereon.

In better investigation on the formation of bubble, the reasons are following. In general, the solution for etching the silicon oxide is dilute HF (HF+$H_2O$) or BOE ($NH_4F$+HF+$H_2O$). However, such wet etchant for etching the silicon oxide has to pass by the silicon surface and reach the silicon oxide layer in many cases on MEMS application. Unfortunately, the silicon surface is hydrophobic for those etching solution.

Further, if the silicon oxide layer is etched via the cavity 102 of silicon or semiconductor, it is easy for the bubble to form in the cavity and the etchant stops reaching the silicon oxide when the MEMS device is immerged into the buffered oxide etch solution (BOE) or dilute HF. The high surface tension for the buffered oxide etch solution causes hydrophobicity to the silicon surface. As a result, the bubble very possible exits if the MEMS device is directly performed with the wet etching process by the wet etchant.

After then, in order to complete the etching process, in the step S102, the MEMS device is further put in water tank for cleaning. In step S104, the MEMS device is further put in an isopropyl alcohol (IPA) tank for further clean, in which the IPA material has surface tension lower than that of the water to avoid the diaphragm 110 from sticking on the backplate 104. After then, the MEMS device is dried in step S106.

As can be seen in the wet etching process of FIGS. 3-4, the bubble 120 is an issue during the process of releasing the diaphragm of the MEMS device. It should also be noted that the MEMS device with the delicate diaphragm cannot be applied with ultrasonic cleaning process to remove the bubble because the diaphragm may be damaged. In consideration of the above, the invention has proposed a wet etching process to the MEMS device.

To solve the bubble issue, the surfactants can be added into the wet etchant (e.g. BOE, or dilute HF) to improve the wettability and reduce the surface tension of etchant. However, such surfactant may change the etching rate and is hard to change the characteristic of hydrophobicity of silicon surface.

Even further, if the wet etching process includes megasonic or ultrasonic, the bubble may be removed. However, the MEMS structure will be damaged.

Figure 5:
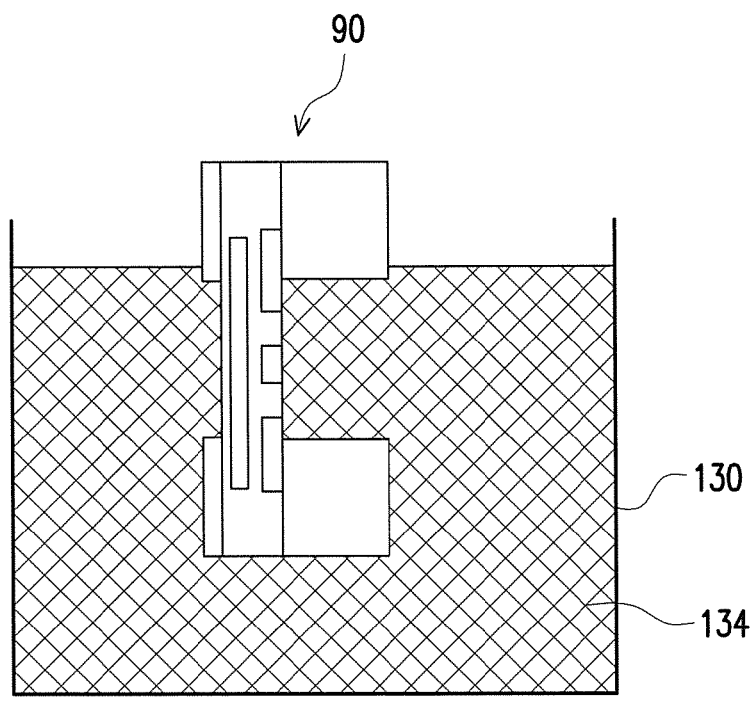
FIG. 5 is a fabrication procedure, schematically illustrating a pre-wetting procedure before etching dielectric material of the MEMS device, according to an embodiment of the invention.
Figure 6:
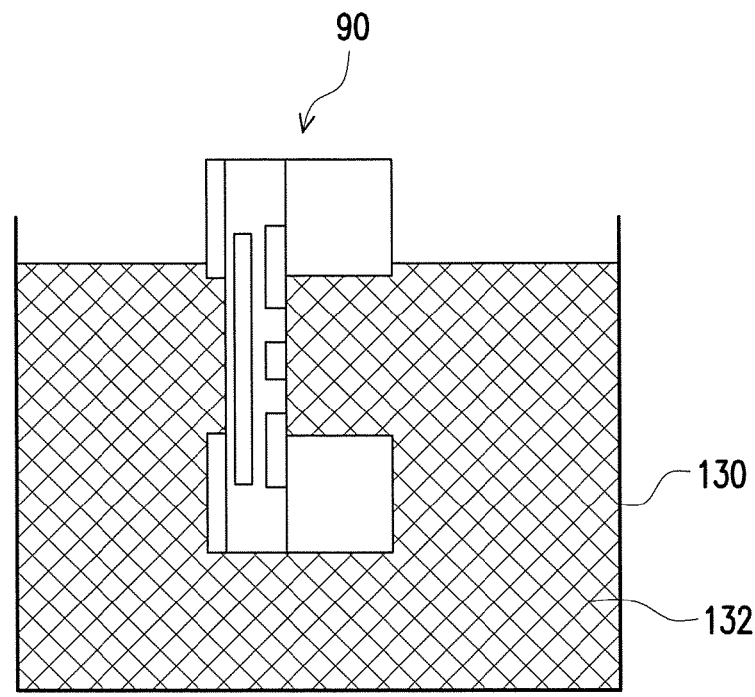
FIG. 6 is a fabrication procedure, schematically illustrating a wet etching process after the pre-wetting procedure for etching dielectric material of the MEMS device, according to an embodiment of the invention.
Figure 7:
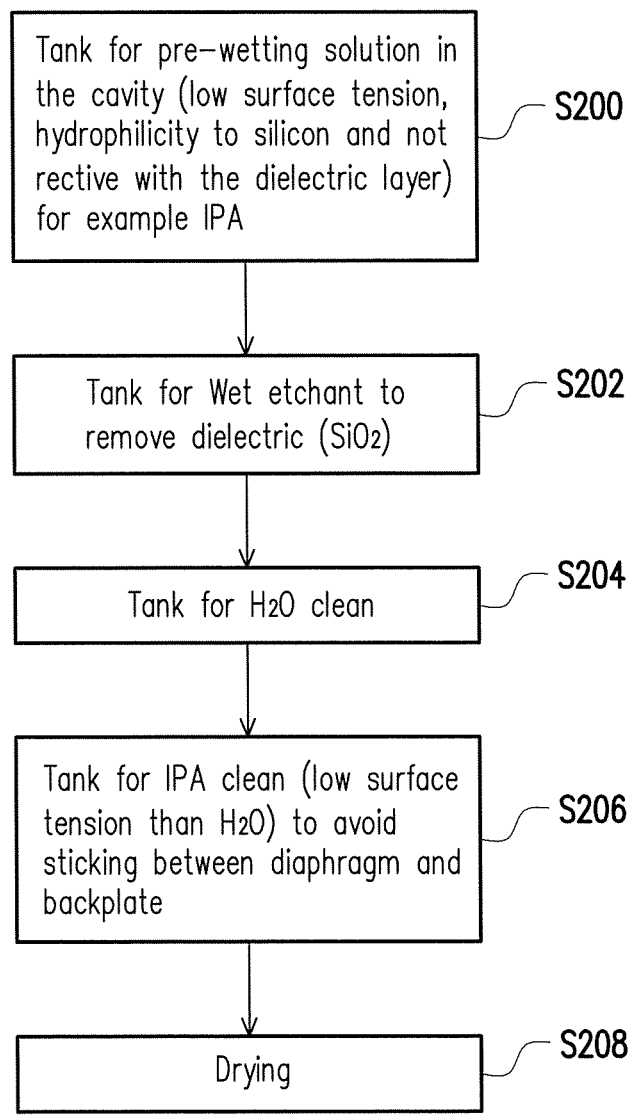
FIG. 7 is a procedure flow chart, schematically illustrating the etching process, according to an embodiment of the invention.

The invention has proposed a pre-wetting process before the wet etching process. FIG. 5 is a fabrication procedure, schematically illustrating a pre-wetting procedure before etching dielectric material of the MEMS device, according to an embodiment of the invention. FIG. 6 is a fabrication procedure, schematically illustrating a wet etching process after the pre-wetting procedure for etching dielectric material of the MEMS device, according to an embodiment of the invention. FIG. 7 is a procedure flow chart, schematically illustrating the etching process, according to an embodiment of the invention.

In FIG. 7 with reference to FIG. 5 and FIG. 6, the method of releasing the diaphragm includes a pre-setting process in step S200. As also referring to FIG. 5, the MEMS device 90 is put in a tank with the pre-wetting solution 134. The pre-wetting solution 134 is to pre-wet the semiconductor surface of the cavity 102 to avoid the formation of the bubble. In this condition, the pre-wetting solution 134 may have the property being hydrophilic to silicon substrate. The pre-wetting solution can be, for example, methyl alcohol, ethyl alcohol, isopropyl alcohol (IPA), alcohols, or hydrofluoroether isopropyl alcohol.

The pre-wetting solution can enter the cavity 102 to wet the semiconductor surface of the cavity, in which the pre-wetting solution does not necessary to necessarily etch or react to the dielectric material. Due to low surface tension, the bubble does not occur on the semiconductor surface of the cavity.

In step S202, as also referring to FIG. 6, the wet etching process can be performed to remove a portion of the dielectric layer 108 and release the diaphragm 110 in the tank with the wet etchant 132. Because no bubble exits in the cavity 102, the wet etching process can be efficiently performed without being stopped by the bubble 120 described in FIG. 3. The wet etching process can be performed efficiently to release the diaphragm.

In step S204, the MEMS is cleaned by water. In step S206, the MEMS device is further cleaned by another liquid, which has surface tension lower than that of the water, such as methyl alcohol, ethyl alcohol, isopropyl alcohol, alcohols, or hydrofluoroether isopropyl alcohol. The step S206 can prevent the diaphragm 110 from sticking with the backplate. In step S208, the MEMS device is then dried.

The invention has proposed that the pre-wetting process is performed on the MEMS device. The occurrence of bubbles in cavity can be effectively suppressed, and the performance of the wet etching process can be improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for releasing a diaphragm of a micro-electro-mechanical systems (MEMS) device at a stage of semi-finished product, comprising:
   pre-wetting the MEMS device in a pre-wetting solution to at least pre-wet a sidewall surface of a cavity of the MEMS device, wherein a dielectric material of a dielectric layer remains not being etched by the pre-wetting solution, and the pre-wetting solution is methyl alcohol, ethyl alcohol, isopropyl alcohol, alcohols, or hydrofluoroether; and
   performing a wet etching process through the cavity after the step of pre-wetting the MEMS device to etch the dielectric material of the dielectric layer for holding the diaphragm, wherein a sensing portion of the diaphragm is released from the dielectric layer,
   wherein the pre-wetting solution is different from an etchant used by the wet etching process.

2. The method of claim 1, further comprising:
   cleaning the MEMS device in a first liquid;
   dipping the MEMS device into a second liquid with a surface tension lower than a surface tension of the first liquid, for avoiding sticking between the diaphragm and the backplate; and
   drying the MEMS device.

3. The method of claim 2, wherein the first liquid is water and the second liquid is methyl alcohol, ethyl alcohol, isopropyl alcohol, alcohols, or hydrofluoroether isopropyl alcohol.

4. A method for releasing a diaphragm of a micro-electro-mechanical systems (MEMS) device at a stage of semi-finished product, comprising:
   pre-wetting the MEMS device in a pre-wetting solution to at least pre-wet a sidewall surface of a cavity of the MEMS device, wherein a dielectric material of a dielectric layer remains not being etched by the pre-wetting solution, and the pre-wetting solution is methyl alcohol, ethyl alcohol, isopropyl alcohol, alcohols, or hydrofluoroether;
   performing a wet etching process after the step of pre-wetting the MEMS device to etch the dielectric material of the dielectric layer for holding the diaphragm, wherein a sensing portion of the diaphragm is released from the dielectric layer, wherein the pre-wetting solution is different from an etchant used by the wet etching process for etching the dielectric material;
   cleaning the MEMS device in a first liquid;
   dipping the MEMS device into a second liquid with a surface tension lower than a surface tension of the first liquid, for avoiding sticking between the diaphragm and the backplate; and
   drying the MEMS device.

5. The method of claim 4, wherein the first liquid is water and the second liquid is methyl alcohol, ethyl alcohol, isopropyl alcohol, alcohols, or hydrofluoroether isopropyl alcohol.

6. The method of claim 1, wherein the cavity of the MEMS device is the cavity in a semiconductor substrate of the MEMS device.

7. The method of claim 4, wherein the cavity of the MEMS device is the cavity in a semiconductor substrate of the MEMS device.

* * * * *